(12) United States Patent
Mehta et al.

(10) Patent No.: US 10,956,064 B2
(45) Date of Patent: Mar. 23, 2021

(54) ADJUSTING CODE RATES TO MITIGATE CROSS-TEMPERATURE EFFECTS IN A NON-VOLATILE MEMORY (NVM)

(71) Applicant: Seagate Technology LLC, Cupertino, CA (US)

(72) Inventors: Darshana H. Mehta, Shakopee, MN (US); Kurt Walter Getreuer, Colorado Springs, CO (US); Antoine Khoueir, Apple Valley, MN (US); Christopher Joseph Curl, Colorado Springs, CO (US)

(73) Assignee: Seagate Technology LLC, Fremont, CA (US)

( * ) Notice: Subject to any disclaimer, the term of this patent is extended or adjusted under 35 U.S.C. 154(b) by 3 days.

(21) Appl. No.: 16/456,809

(22) Filed: Jun. 28, 2019

(65) Prior Publication Data
US 2020/0409579 A1   Dec. 31, 2020

(51) Int. Cl.
| | | |
|---|---|---|
| *G11C 29/00* | (2006.01) | |
| *G06F 3/06* | (2006.01) | |
| *G06F 11/10* | (2006.01) | |
| *G11C 29/52* | (2006.01) | |
| *H03M 13/11* | (2006.01) | |
| *G11C 16/04* | (2006.01) | |
| *G11C 16/10* | (2006.01) | |
| *G11C 16/26* | (2006.01) | |
| *G11C 11/56* | (2006.01) | |

(52) U.S. Cl.
CPC .......... *G06F 3/0632* (2013.01); *G06F 3/0619* (2013.01); *G06F 3/0659* (2013.01); *G06F 3/0679* (2013.01); *G06F 11/1068* (2013.01); *G11C 16/0483* (2013.01); *G11C 16/10* (2013.01); *G11C 16/26* (2013.01); *G11C 29/52* (2013.01); *H03M 13/1102* (2013.01); *G11C 11/5621* (2013.01); *G11C 2216/14* (2013.01)

(58) Field of Classification Search
None
See application file for complete search history.

(56) References Cited

U.S. PATENT DOCUMENTS

| | | |
|---|---|---|
| 6,559,538 B1 | 5/2003 | Pomerene et al. |
| 8,040,725 B2 | 10/2011 | Kang |
| 8,095,851 B2 | 1/2012 | Diggs et al. |
| 8,213,255 B2 | 7/2012 | Hemink et al. |
| | (Continued) | |

*Primary Examiner* — Guerrier Merant
(74) *Attorney, Agent, or Firm* — Hall Estill Attorneys at Law

(57) ABSTRACT

Method and apparatus for managing data in a non-volatile memory (NVM) of a storage device, such as a solid-state drive (SSD). A circuit measures programming and reading temperatures for a set of memory cells in the NVM. Error rates are determined for each of the reading operations carried out upon the data stored in the memory cells. A code rate for the NVM is adjusted to maintain a selected error rate for the memory cells. The code rate is adjusted in relation to a cross-temperature differential (CTD) value exceeding a selected threshold. The code rate can include an inner code rate as a ratio of user data bits to the total number of user data bits and error correction code (ECC) bits in each code word written to the NVM, and/or an outer code rate as a strength or size of a parity value used to protect multiple code words.

20 Claims, 9 Drawing Sheets

(56) References Cited

U.S. PATENT DOCUMENTS

| | | | |
|---|---|---|---|
| 8,344,475 | B2 | 1/2013 | Shaeffer et al. |
| 8,472,274 | B2 | 6/2013 | Fai et al. |
| 9,076,545 | B2 | 7/2015 | Mokhlesi |
| 9,183,000 | B2 | 11/2015 | Ichida et al. |
| 9,201,728 | B2 | 12/2015 | Patapoutian et al. |
| 9,275,741 | B1 | 3/2016 | Liang et al. |
| 9,286,933 | B2 | 3/2016 | Mathew et al. |
| 9,659,664 | B1 | 5/2017 | Griffin et al. |
| 9,668,337 | B2 | 5/2017 | Stoev et al. |
| 2010/0241928 | A1* | 9/2010 | Kim ................. G06F 11/1012 714/763 |
| 2017/0139761 | A1* | 5/2017 | Song ..................... G06F 11/08 |
| 2017/0153843 | A1* | 6/2017 | Dewitt ................. G06F 3/0604 |
| 2018/0351582 | A1* | 12/2018 | Canepa ............... G06F 11/1012 |
| 2019/0267054 | A1* | 8/2019 | Thalaimalaivanaraj ................. G11C 29/42 |
| 2020/0004458 | A1* | 1/2020 | Cerafogli ............ G11C 11/5628 |
| 2020/0211664 | A1* | 7/2020 | Vashi .................... G11C 16/26 |

\* cited by examiner

US 10,956,064 B2

ADJUSTING CODE RATES TO MITIGATE CROSS-TEMPERATURE EFFECTS IN A NON-VOLATILE MEMORY (NVM)

SUMMARY

Various embodiments of the present disclosure are generally directed to a method and apparatus for preemptively mitigating cross-temperature effects in a non-volatile memory (NVM), such as but not limited to a three-dimensional (3D) NAND flash memory device.

In some embodiments, a method includes measuring a sequence of programming temperatures at which data are programmed to non-volatile memory (NVM) cells and reading temperatures at which data are read from the NVM cells; tracking error rates for the NVM cells during each of the reading of the data from the NVM cells; and adjusting a code rate for the NVM cells to maintain a selected error rate responsive to a cross-temperature differential (CTD) value exceeding a selected threshold, the CTD value comprising a difference between a selected programming temperature and a selected reading temperature for the NVM cells.

In other embodiments, an apparatus includes a non-volatile memory (NVM) comprising solid-state memory cells. A read/write circuit is configured to program the memory cells with data bits and to subsequently read the data bits from the memory cells. A tracking circuit is configured to measure error rates for the NVM cells during each of the reading of the data from the NVM cells, and to measure temperatures of the NVM cells during both the programming of the memory cells and the reading of the memory cells. A code word management circuit is configured to adjust a code rate for the NVM cells to maintain a selected error rate responsive to a cross-temperature differential (CTD) value exceeding a selected threshold, the CTD value comprising a difference between the temperature during programming and the temperature during the reading of the NVM cells.

In still further embodiments, a solid-state drive has a flash memory comprising an array of flash memory cells. A write circuit is configured to write a page of data to a selected set of the flash memory cells connected to a common word line in the form of a plurality of code words, each code word comprising a first number of user data bits and a second number of code bits. A read circuit is configured to subsequently read the page of data from the selected set of the flash memory cells by using the code bits in each code word to detect and correct errors in the corresponding user data bits. A tracking circuit is configured to measure a programming temperature of the NVM at a time of the programming of the page of data, to measure a reading temperature of the NVM at a time of the page of data, and to measure a total number of bit errors obtained during the reading of the page of data. A code word management circuit is configured to adjust a code rate for the set of memory cells so that, upon said adjustment, a new page of data subsequently written thereto has a different ratio of code bits to user data bits responsive to the measured programming temperature, the measured reading temperature, and the number of bit errors.

These and other features and advantages which characterize the various embodiments of the present disclosure can be understood in view of the following detailed discussion and the accompanying drawings.

DETAILED DESCRIPTION

Figure 1:
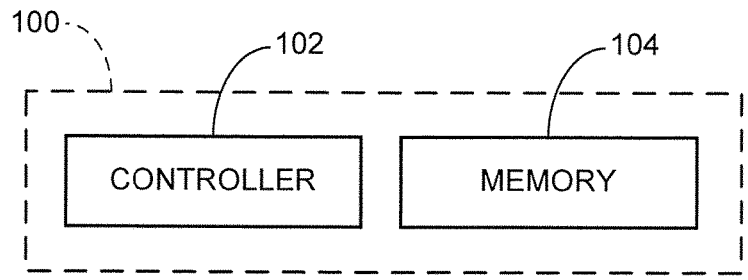
FIG. 1 provides a functional block representation of a data storage device constructed and operated in accordance with various embodiments of the present disclosure.

The present disclosure generally relates to systems and methods for storing data in a non-volatile memory (NVM).

Many current generation data storage devices such as solid state drives (SSDs) utilize NAND flash memory to provide non-volatile storage of data from a host device. Flash memory generally operates to store data in the form of accumulated electrical charge on a floating gate of each memory cell in the flash array. The programmed state can be sensed through the application of one or more read sense voltages to the cell.

These and other forms of erasable memories generally operate by being programmed to store data during a program (write) operation. Once programmed, the data may be read from the associated memory cells during subsequent read operations. The memory cells require an erasure operation to reset the memory cells before the cells can store replacement data. Each program/erase cycle is sometimes referred to as a PE cycle or PE count. A flash memory has a limited total number of PE counts that can be experienced during the operational life of the memory before the memory is worn out and no longer usable.

A limitation that has been observed with these and other forms of semiconductor based NVM is sometimes referred to as a cross-temperature effect. As used herein, the term "cross-temperature" relates to a difference (delta) between the temperature of the memory at the time of the programming of a set of data, and the temperature of the memory at a subsequent time when the set of data are read out from the memory.

If the cross-temperature delta ("CTD") is low, the system tends to provide manageable and consistent numbers of bit errors during read operations. The bit errors may be measured as a bit error rate (BER), which can be stated as a ratio of the number of bit errors to the number of total bits read.

BER can increase significantly with larger cross-temperature differentials. Large CTD values can arise due to a variety of factors including ambient temperature changes, variations in power consumption and workload, and so on. CTD variations are among the leading causes of reliability and data transfer performance degradation in SSDs and other semiconductor based data storage devices.

Accordingly, various embodiments of the present disclosure are generally directed to mitigating the effects of large CTD values and variations thereof in a data storage device, such as but not limited to an SSD that uses 3D NAND flash memory.

As explained below, some embodiments provide a data storage device with a controller circuit and a non-volatile memory (NVM). The controller circuit is configured to write data to the NVM responsive to write commands and data supplied by a host device, and subsequently read and return the data from the NVM responsive to read commands from the host device.

The controller circuit is configured to record parametric data such as temperature at the time of the programming of various sets of data to various locations in the NVM. Other parametric data may be collected at this time such as a time/date code of when the various data sets were written, etc.

The controller circuit proceeds to measure temperature associated with the NVM over time. These temperature measurements enable the controller circuit to generate estimates of a cross-temperature differential ("CTD") for various data sets at different locations throughout the NVM.

The controller circuit tracks and accumulates error rate data for the NVM over time during various read operations in which the data sets are read from the NVM at different CTD values. From this, the controller circuit identifies different locations within the NVM with different cross-temperature sensitivities. Generally, some locations may be more sensitive and hence, provide relatively higher (worse) error rates with respect to temperature variations while other locations may be less sensitive and provide lower (better) error rates with respect to temperature variations.

The controller circuit proceeds to adjust various code rates for the NVM to maintain a selected acceptable level of error rate performance for all locations across the memory. Those locations exhibiting greater temperature sensitivity will receive a higher code rate (e.g., greater number of code bits per code word) while those locations exhibiting lower temperature sensitivity will maintain the existing code rate, or in at least some cases, receive a lower code rate. In further embodiments, adjustments can be made to outer code size and/or strength to compensate for the temperature sensitivity of the NVM.

A higher code rate tends to provide a higher level of support for the recovery of the user bits stored to the memory, so that the additional code bits that are present for a higher code rate makes it easier for the memory to output the user bits accurately. In this way, the code rates utilized by the NVM can be adjusted over time to provide consistent, acceptable levels of error rate performance for all locations within the memory over a wide variety of temperature differentials.

These and other features and advantages of various embodiments can be understood beginning with a review of FIG. 1 which provides a functional block diagram of an exemplary data storage device 100. The device 100 is characterized as a solid-state drive (SSD) that employs non-volatile semiconductor memory such as 3D NAND flash memory, although the present disclosure is not so limited.

The device 100 includes a controller circuit 102 which provides top-level control and communication functions as the device interacts with a host device (not shown) to store and retrieve host user data. A memory module 104 provides non-volatile storage of the data in the form of an array of flash memory cells.

The controller 102 may be a programmable CPU processor that operates in conjunction with programming stored in a computer memory within the device. The controller may alternatively be a hardware controller. The controller may be a separate circuit or the controller functionality may be incorporated directly into the memory array 104.

As used herein, the term controller and the like will be broadly understood as an integrated circuit (IC) device or a group of interconnected IC devices that utilize a number of fundamental circuit elements such as but not limited to transistors, diodes, capacitors, resistors, inductors, waveguides, circuit paths, planes, printed circuit boards, memory elements, etc. to provide a functional circuit regardless whether the circuit is programmable or not. The controller may be arranged as a system on chip (SOC) IC device, a programmable processor, a state machine, a hardware circuit, a portion of a read channel in a memory module, etc.

Figure 2:
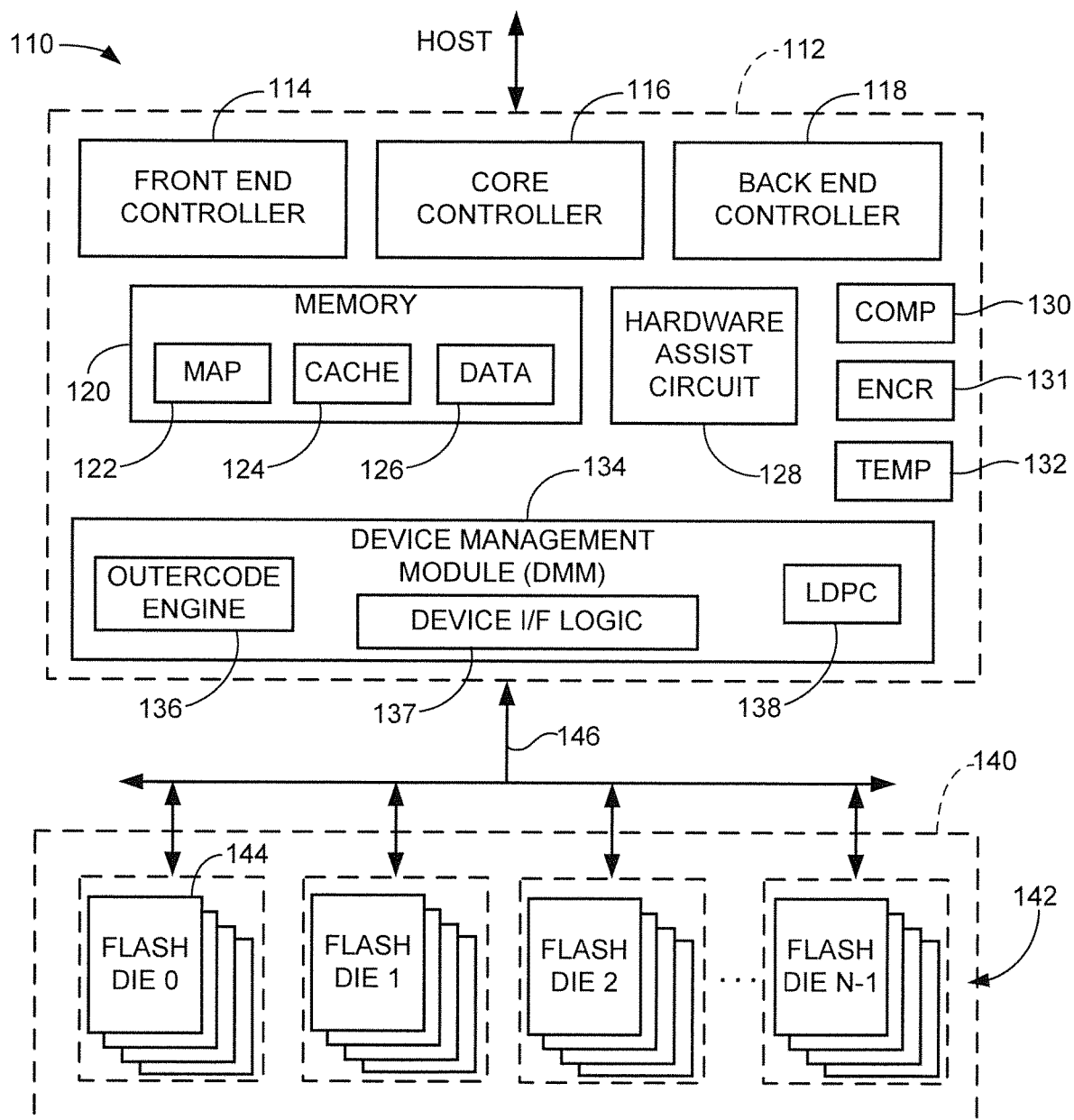
FIG. 2 illustrates the data storage device of FIG. 1 characterized as a solid state drive (SSD) that uses NAND flash memory in accordance with some embodiments.

In order to provide a detailed explanation of various embodiments, FIGS. 2 through 9 have been provided to describe relevant aspects of an exemplary data storage device 110 corresponding to the device 100 of FIG. 1. The device 110 is shown in FIG. 2 to be configured as a solid state drive (SSD) that communicates with one or more host devices via one or more Peripheral Component Interface Express (PCIe) ports. The NVM is contemplated as comprising NAND flash memory, although other forms of solid state non-volatile memory can be used.

In at least some embodiments, the SSD operates in accordance with the NVMe (Non-Volatile Memory Express) Standard, which enables different users to allocate NVM sets (die sets) for use in the storage of data. Each die set may form a portion of an NVMe Namespace that may span multiple SSDs or be contained within a single SSD. Each NVMe Namespace will be owned and controlled by a different user (owner). While aspects of various embodiments are particularly applicable to devices operated in accordance with the NVMe Standard, such is not necessarily required.

The SSD 110 includes a controller circuit 112 with a front end controller 114, a core controller 116 and a back end controller 118. The front end controller 114 performs host I/F functions, the back end controller 118 directs data transfers with the memory module 114 and the core controller 116 provides top level control for the device.

Each controller 114, 116 and 118 includes a separate programmable processor with associated programming (e.g., firmware, FW) in a suitable memory location, as well as various hardware elements to execute data management and transfer functions. This is merely illustrative of one embodiment; in other embodiments, a single programmable processor (or less/more than three programmable processors) can be configured to carry out each of the front end, core and back end processes using associated FW in a suitable memory location. A pure hardware based controller configuration can alternatively be used. The various controllers may be integrated into a single system on chip (SOC) integrated circuit device, or may be distributed among various discrete devices as required.

A controller memory 120 represents various forms of volatile and/or non-volatile memory (e.g., SRAM, DDR DRAM, flash, etc.) utilized as local memory by the controller 112. Various data structures and data sets may be stored by the memory including one or more map structures 122, one or more caches 124 for map data and other control information, and one or more data buffers 126 for the temporary storage of host (user) data during data transfers.

A non-processor based hardware assist circuit 128 may enable the offloading of certain memory management tasks by one or more of the controllers as required. The hardware circuit 128 does not utilize a programmable processor, but instead uses various forms of hardwired logic circuitry such as application specific integrated circuits (ASICs), gate logic circuits, field programmable gate arrays (FPGAs), etc.

Additional functional blocks can be realized in or adjacent the controller 112, such as a data compression block 130, an encryption block 131 and a temperature sensor block 132. The data compression block 130 applies lossless data compression to input data sets during write operations, and subsequently provides data de-compression during read operations. The encryption block 131 applies cryptographic functions including encryption, hashes, decompression, etc. The temperature sensor 132 senses temperature of the SSD at various locations.

A device management module (DMM) 134 supports back end processing operations and may include an outer code engine circuit 136 to generate outer code, a device I/F logic circuit 137 and a low density parity check (LDPC) circuit 138 configured to generate LDPC codes as part of the error detection and correction strategy used to protect the data stored by the SSD 110.

A memory module 140 corresponds to the memory 104 in FIG. 1 and includes a non-volatile memory (NVM) in the form of a flash memory 142 distributed across a plural number N of flash memory dies 144. Flash memory control electronics (not separately shown in FIG. 2) may be provisioned on each die 144 to facilitate parallel data transfer operations via a number of channels (lanes) 146.

Figure 3:
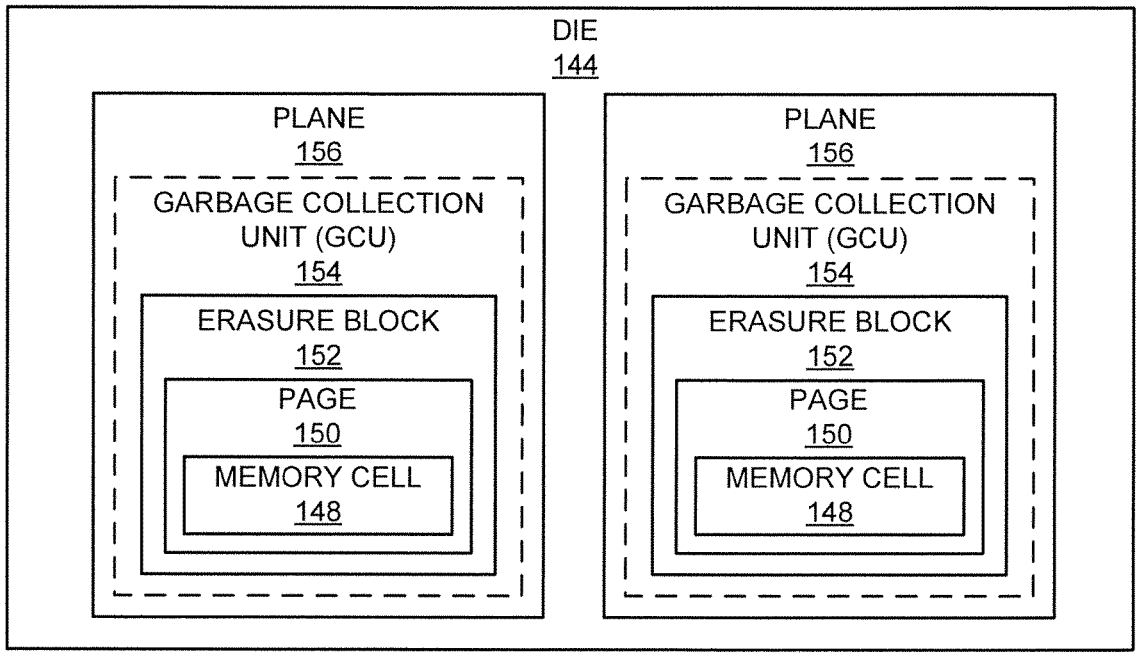
FIG. 3 is a physical and functional layout of the flash memory of FIG. 2 in some embodiments.

FIG. 3 shows a physical/logical arrangement of the various flash memory dies 144 in the flash memory 142 of FIG. 2 in some embodiments. Each die 144 incorporates a large number of flash memory cells 148. The cells may be arrayed in a two-dimensional (2D) or three-dimensional (3D stacked) arrangement with various control lines (e.g., source, bit, word lines) to access the cells.

Groups of cells 148 are interconnected to a common word line to accommodate pages 150, which represent the smallest unit of data that can be accessed at a time. Depending on the storage scheme, multiple pages of data may be written to the same physical row of cells, such as in the case of MLCs (multi-level cells), TLCs (three-level cells), QLCs (four-level cells), and so on. Generally, n bits of data can be stored to a particular memory cell 148 using $2^n$ different charge states (e.g., TLCs use eight distinct charge levels to represent three bits of data, etc.). The storage size of a page can vary; some current generation flash memory pages are arranged to store 16 KB (16,384 bytes) of user data.

The memory cells 148 associated with a number of pages are integrated into an erasure block 152, which represents the smallest grouping of memory cells that can be concurrently erased in a NAND flash memory. A number of erasure blocks 152 are turn incorporated into a garbage collection unit (GCU) 154, which are logical storage units that utilize erasure blocks across different dies as explained below. GCUs are allocated and erased as a unit, and tend to span multiple dies.

During operation, a selected GCU is allocated for the storage of user data, and this continues until the GCU is filled. Once a sufficient amount of the stored data is determined to be stale (e.g., no longer the most current version), a garbage collection operation can be carried out to recycle the GCU. This includes identifying and relocating the current version data to a new location (e.g., a new GCU), followed by an erasure operation to reset the memory cells to an erased (unprogrammed) state. The recycled GCU is returned to an allocation pool for subsequent allocation to begin storing new user data. In one embodiment, each GCU 154 nominally uses a single erasure block 152 from each of a plurality of dies 144, such as 32 dies.

Each die 144 may further be organized as a plurality of planes 156. Examples include two planes per die as shown in FIG. 3, although other numbers of planes per die, such as four or eight planes per die can be used. Generally, a plane is a subdivision of the die 144 arranged with separate read/write/erase circuitry such that a given type of access operation (such as a write operation, etc.) can be carried out simultaneously by each of the planes to a common page address within the respective planes.

Figure 4:
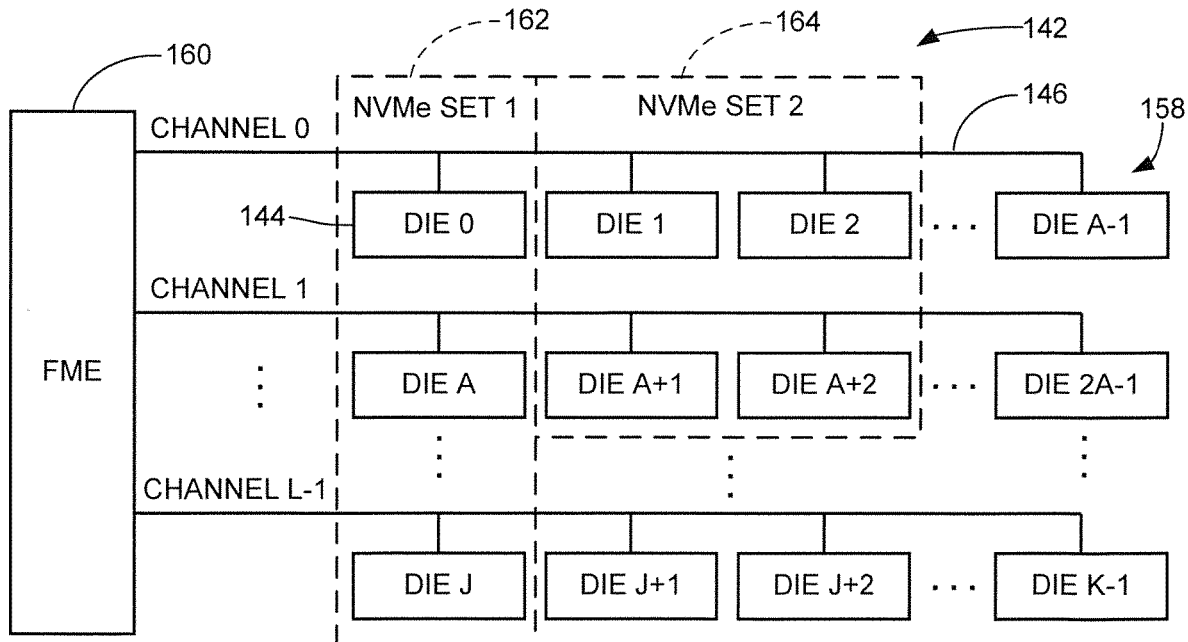
FIG. 4 shows the grouping of various dies of the flash memory of FIG. 2 in various die and NVM sets in some embodiments.

FIG. 4 shows further aspects of the flash memory 142 in some embodiments. A total number K dies 144 are provided and arranged into physical die groups 158. Each die group 158 is connected to a separate channel 146 using a total number of L channels. Flash memory electronics (FME) circuitry 160 of the flash memory module 142 controls each of the channels 146 to transfer data to and from the respective die groups 158. In one non-limiting example, K is set to 128 dies, L is set to 8 channels, and each physical die group has 16 dies. In this way, any of the 16 dies physically connected to a given channel 146 can be accessed at a given time using the associated channel. Generally, only one die per channel can be accessed at a time.

In some embodiments, the various dies are arranged into one or more NVMe sets. An NVMe set, also referred to a die set, represents a portion of the storage capacity of the SSD that is allocated for use by a particular host (user/owner). NVMe sets are established with a granularity at the die level, so that each NVMe set will encompass a selected number of the available dies 144.

A first example NVMe set is denoted at 162 in FIG. 4. This first set 162 uses a single die 144 from each of the different channels 146. This arrangement provides fast performance during the servicing of data transfer commands for the set since all eight channels 146 are used to transfer the associated data to service a host access command. A limitation with this approach is that if the set 162 is being serviced, no other NVM sets can be serviced during that time interval. While the set 162 only uses a single die from each channel, the set could also be configured to use multiple dies from each channel, such as four (4) dies per channel for a total of 32 dies.

A second example NVMe set is denoted at 164 in FIG. 4. This set uses dies 144 from less than all of the available channels 146. This arrangement provides relatively slower overall performance during data transfers as compared to the set 162, since for a given size of data transfer, the data will be transferred using fewer channels. However, this arrangement advantageously allows the SSD to service multiple NVMe sets at the same time, provided the sets do not share a common channel 146.

Figure 5:
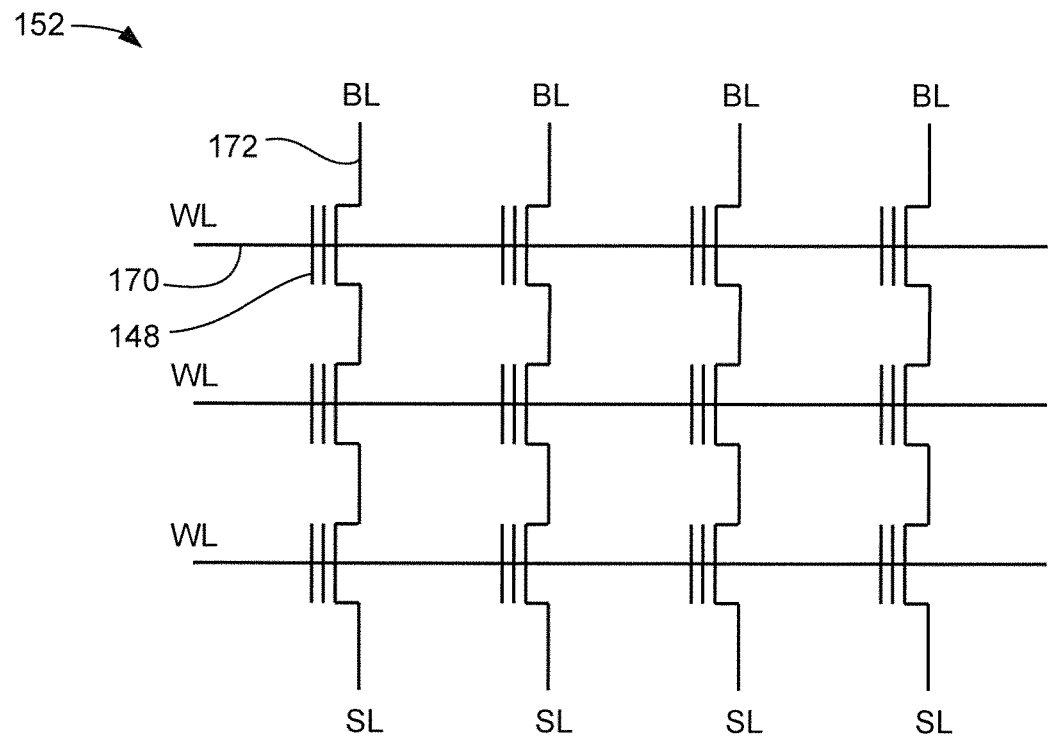
FIG. 5 provides a schematic depiction of a portion of the flash memory of FIG. 2 as operated by some embodiments.

FIG. 5 is a simplified schematic depiction of a portion of a selected erasure block 152 from FIG. 3. The flash memory cells 148 each generally take a MOSFET (metal oxide semiconductor field effect transistor) configuration with respective control gate, source and drain regions. A floating gate is isolated between the control gate and the channel between the source and drain.

The cells 148 are arranged in a matrix connected by word lines (WL) 170, bit lines (BL) 172 and source lines (SL) 174. During normal program (write) and read operations, current is passed from the BL to the SL through each stack in turn. This may take place by connecting the BL to a suitable rail voltage, such as 3.3V, and connecting the SL to a suitable reference level, such as electrical ground. The WLs 170 are connected to the control gates of the memory cells 148. Variable gate control voltages (read voltages) are supplied to the memory cells via the WLs to read the programmed states of the cells. Pages of data are stored along the memory cells attached to a common word line (WL). Programming (write), read and erase operations may be carried out by supplying different combinations of voltages to the respective control lines to respectively apply, sense or remove accumulated charge to or from the floating gates. These voltages are applied by presenting read voltage set points (multi-bit digital representations) that are converted to gate voltages by internal NAND read circuitry.

Figure 6:
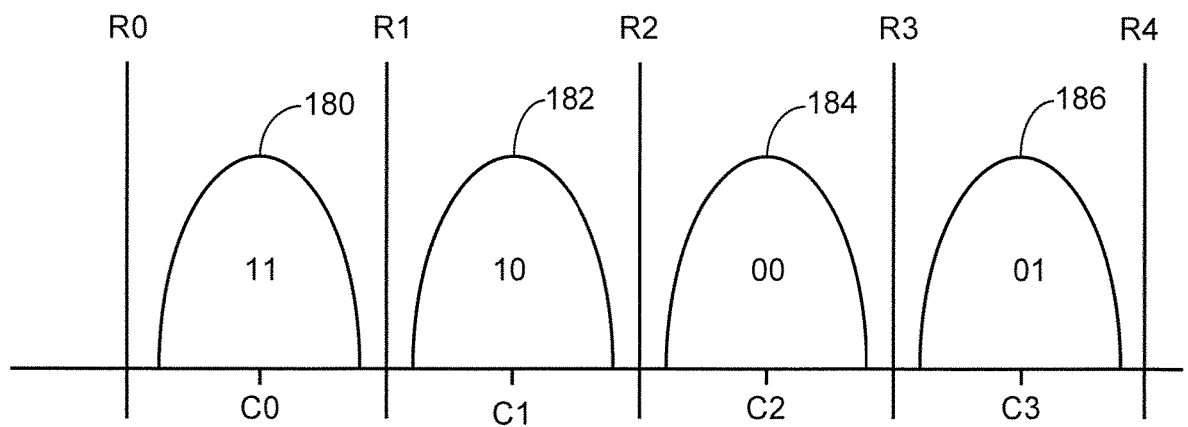
FIG. 6 shows charge distributions and associated read voltage set points for the flash memory of FIG. 2 that may be generated by some embodiments.

FIG. 6 shows different populations of charge distributions that may be applied to the various memory cells 148 in FIG. 5. For ease of discussion, FIG. 6 depicts MLC (multi-level cell) programming so that each memory cell can have up to four charge states to depict two (2) bits of programming. As noted above, other programming schemes can be used including TLC (8 charge states to depict 3 bits), QLC (16 charge bits to depict 4 bits), etc., so the depiction of MLCs is merely exemplary and is not limiting.

The four charge distributions C0-C3 are denoted at 180, 182, 184 and 186 and represent respective two-bit combinations of 11, 10, 00 and 01. Other encoding schemes can be used. For a given set of cells 148 attached to a common WL 170, the MSB stored in each cell represents a logical bit value from a first page of data and the LSB stored in each cell represents a logical bit value from a second page of data.

The read voltage set points (levels) R0-R4 represent control gate (read) voltages necessary to place the different populations of memory cells into a forward (source-to-drain) conductive state. The read voltage set point R2 is sufficient to place all of the memory cells in populations 180 and 182 in a conductive state, but not those cells in populations 184 and 186. The read voltage set point R4 is sufficiently high to place all of the cells in a forward conductive state, while the read voltage set point R0 is insufficient to place any of the cells in a forward conductive state. By applying different sequences of the read voltage set points R0-R4 during a read operation and sensing whether the associated cells become conductive, the individual charge state of the cells can be determined.

Figure 7:
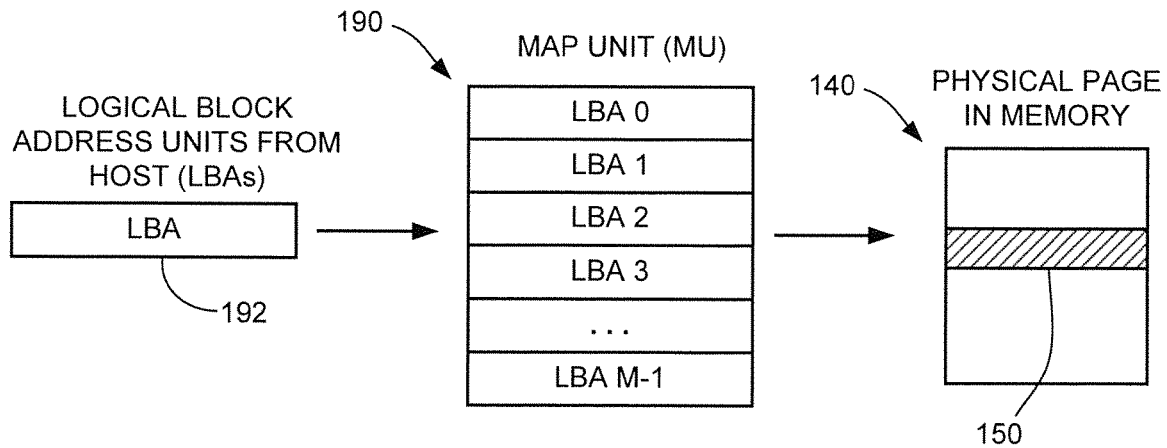
FIG. 7 shows a manner in which data may be arranged for storage by the SSD of FIG. 2 in some embodiments.

FIG. 7 shows an example format for data stored to the flash memory 140 in some embodiments. So-called map units (MUs) 190 represent fixed sized blocks of data that are made up of one or more user logical block address units (LBAs) 192 supplied by the host. Without limitation, the LBAs 192 may have a first nominal size, such as 512 bytes (B), 1024 B (1 KB), 4096 B (4 KB), etc., and the MUs 190 may have a second nominal size, such as 16,384 B (16 KB), 32,768 B (32 KB), etc. The application of data compression may cause each MU to have a smaller size in terms of actual bits written to the flash memory 140. The MUs 190 are arranged into pages 150 (see FIG. 3) which are written to the memory.

Figure 8:
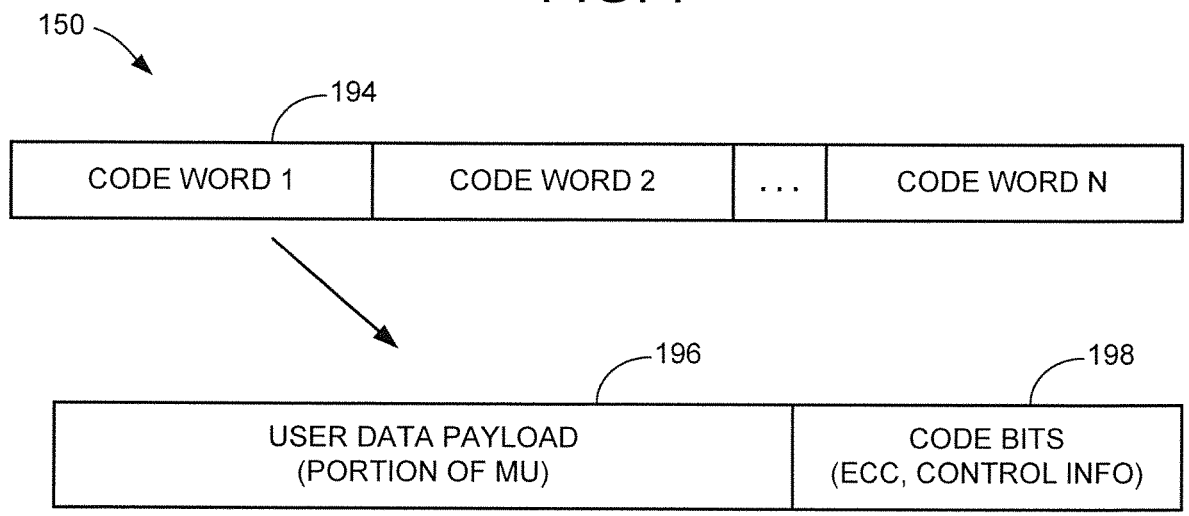
FIG. 8 shows the arrangement of the data of FIG. 7 into code words.

FIG. 8 shows the page 150 of FIG. 7 arranged as an integer number of code words 194 each of selected length. Each code word 194 includes a user data portion (payload) 196 and a code bit (parity) portion 198. The user data portion 196 stores user bits from one or more of the MUs 190 of FIG. 7. The code bit portion 198 stores LDPC or other forms of error correction code (ECC) bits associated with the user data bits. As will be recognized, during a reading operation the ECC bits are used to verify and correct, as required, the user data bits during one or more iterations through an ECC decoder circuit.

The ECC bits in the code bit portion 198 (also sometimes referred to as "code bits") are written as inner code bits at a selected inner code rate to provide at least a desired BER for the user data bits in portion 196. The inner code rate can be defined as the ratio of the number of user bits to the total number of bits in the entire code word 194 (e.g., the total number of user bits in the payload portion 196 plus the number of code bits, or ECC bits, in the code bit portion 198).

Figure 9:
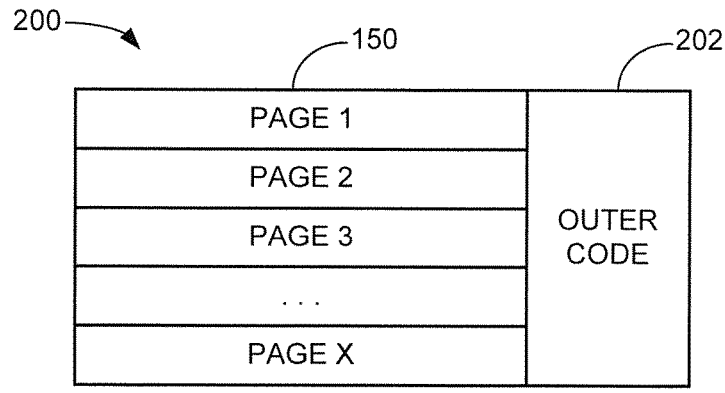
FIG. 9 shows the arrangement of the code words of FIG. 8 into parity sets.

FIG. 9 is a diagrammatical representation of a parity data set 200 made up of a plural number X data pages 150 that are protected by an outer code block 202. Each page 150 is formed of multiple code words 194 as shown in FIG. 8 and may be written at a selected location in a garbage collection unit (GCU) 154 (FIG. 3) across multiple dies 144 (FIG. 2). The outer code block 202 represents parity values that enable the system to reconstruct the contents of one or more of the pages 150.

While not limiting, RAID type parity value techniques can be used to calculate the outer code parity values. In one embodiment, the outer code block 202 occupies essentially an entire page, so that X is some multiple number of pages and an outer code rate of 1/X is provided by the outer code. This is not limiting as the outer code can occupy any suitable amount of space in the flash memory, including less than or more than a page for a given parity set.

Figure 10A:
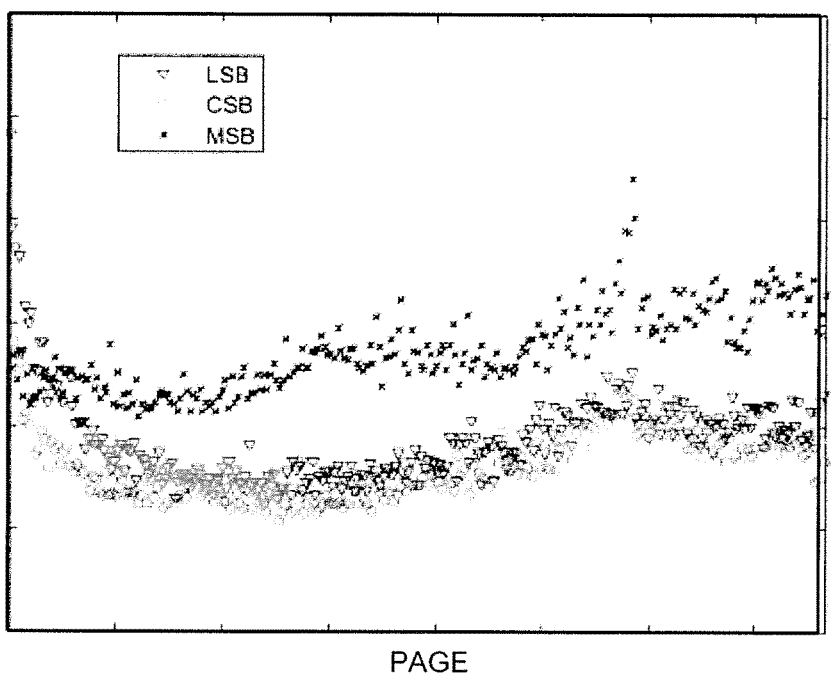
FIGS. 10A and 10B show graphical depictions of changes in bit error rate (BER) performance for different cross-temperature differentials (CTDs) of the SSD of FIG. 2.
Figure 10B:
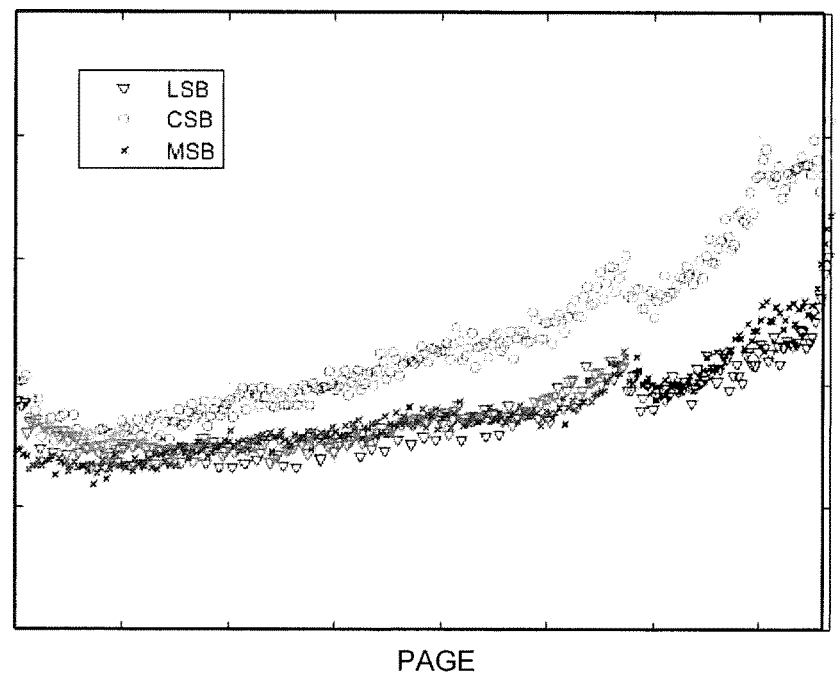

Having now provided an overview of the operation of the SSD 110 of FIG. 2, FIGS. 10A and 10B illustrate the effects on bit error rate (BER) performance for data stored to the flash memory 140 as described above under different temperature conditions.

FIG. 10A shows a graphical representation of BER data for different pages that have a relatively low cross-temperature differential (CTD) value; that is in FIG. 10A, both program and read temperatures were near the same temperature. The data are plotted for TLC cells (three bits per cell) for both reads on the least, center and most significant bits (LSB, CSB and MSB page types). It can be seen that, generally, steady state BER values can be obtained across a large sample of page values. Different page types, most notably the MSB page types, tend to provide worse BER performance.

FIG. 10B shows a graphical representation of BER data for different pages that have a relatively high CTD value, in this case, a read temperature that was about 70° C. higher than the program temperature. The BER values in FIG. 10B are several multitudes higher (e.g., 4× to 20× or more) as compared to the BER values in FIG. 10A, with the CSB page types exhibiting the worst BER performance for certain pages. It will be appreciated that different word line values/locations (e.g., WLn) within various erasure blocks can provide significantly different CTD responses.

One reason that temperature excursions such as in FIG. 10B lead to increased BER values relates to charge drift; at higher temperatures, the various memory cells become conductive at different control gate (read) voltage levels so that read voltage set points such as the values R0-R4 in FIG. 6 may not be sufficient to accurately discern the programmed state of the individual cells.

Figure 11:
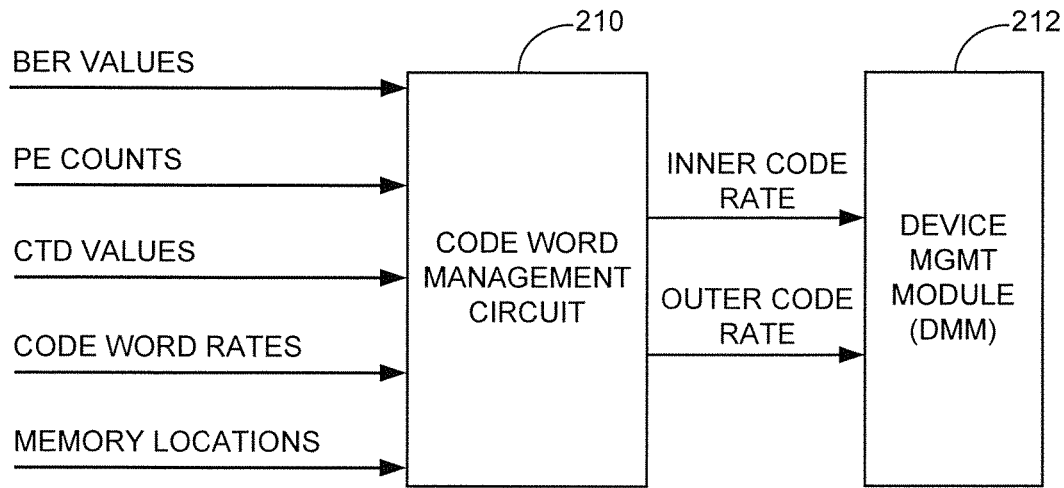
FIG. 11 is a functional block representation of a code word management circuit (CWMC) constructed and operated in accordance with some embodiments.

Accordingly, FIG. 11 shows a functional block representation of a code word management circuit (CWMC) 210 that operates to compensate for these and other limitations of the existing art. The CTMC 210 can take a variety of forms based on the requirements of a given application. It is contemplated in some embodiments that the CWMC 210 represents one or more firmware routines stored in a suitable memory location and executed by one or more processors of the SSD controller 112 discussed above (see FIG. 2). Other circuit configurations can be used.

Generally, the CTMC 210 operates as a background process to evaluate BER read performance of various locations within the flash memory 140 over time and in view of various parameters such as CTD, PE counts, data retention (aging), read counts, locations (e.g., WLn), etc. From this data, the CWMC 210 characterizes the BER performance and sorts various memory locations by temperature sensitivity.

Those locations that show greater sensitivity to temperature excursions are provided with additional code bits (e.g., higher code rates) to assist the memory in reliability recovering the stored user data. Those locations that show an ability to reliably output the user data bits over wide temperature excursions retain the existing code rates or, in some cases, may be provided with reduced code rates to enable the storage of relatively greater amounts.

To this end, the CWMC 210 receives various inputs including BER values, PE counts, calculated CTD values and existing code word data. These values are used to evaluate, on a memory location basis, appropriate inner code rates, and, as desired, appropriate outer code rates for use by a device management module (DMM) circuit 212 that establishes the appropriate code words during operation. Any suitable granularity can be used with regard to the code rates that are employed; in some embodiments, the code rates are adjusted on an individual word line basis (e.g., WLX in a particular set of erasure blocks may use one code rate while WLY in a the same set of erasure blocks may be assigned a different code rate, etc.). In this way, a "lower code rate" will be understood to use fewer code bits per unit of user data and provide weaker ECC and a "higher code rate" will be understood to use more code bits per unit of user data and provide stronger ECC.

Figure 12:
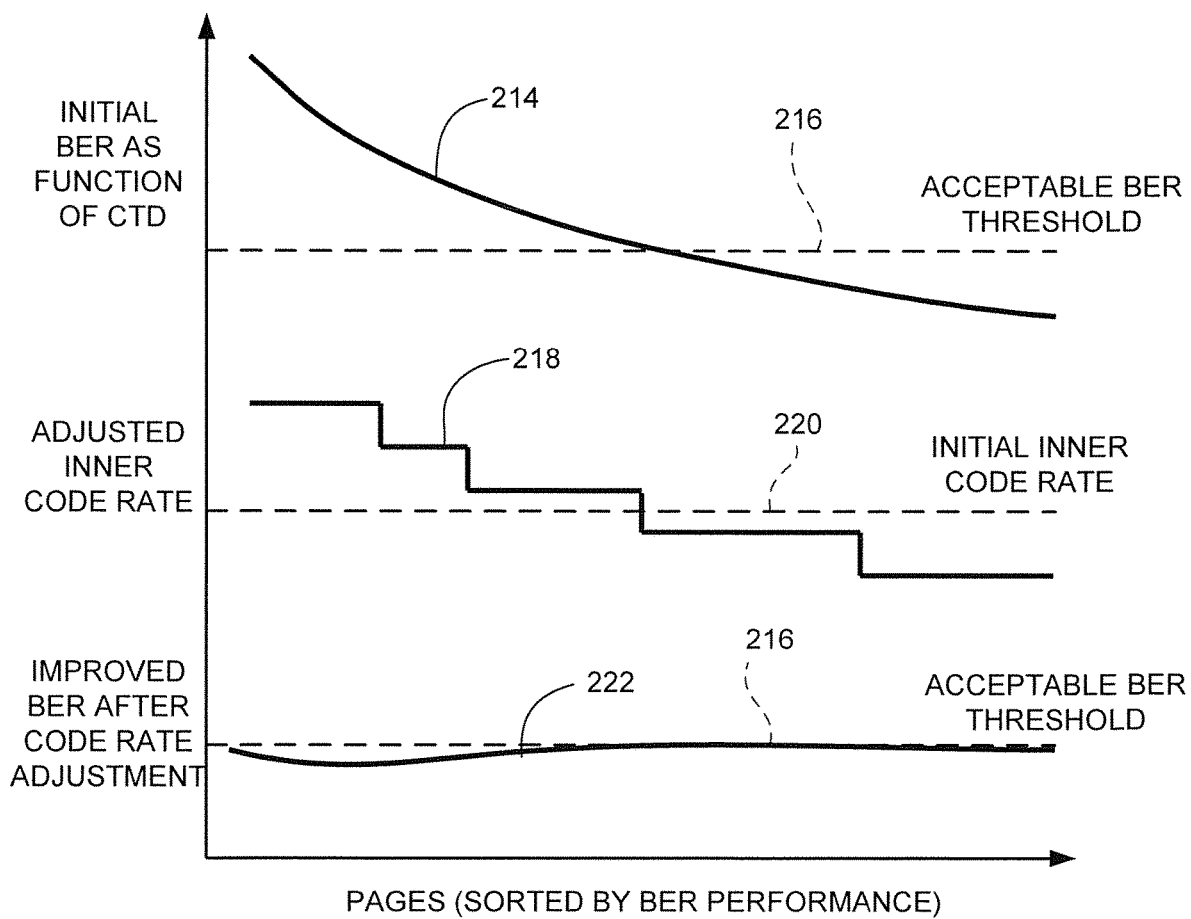
FIG. 12 is a graphical representation of the operation of the CWMC of FIG. 11 in some embodiments.

FIG. 12 shows various graphical representations of the operation of the CWMC 210 of FIG. 11. Curve 214 represents an initial BER performance curve as a function of CTD for different pages in the memory 140, sorted from the worst performing page to the best performing page. Line 216 represents an acceptable average BER threshold indicative of a level of BER that can be tolerated by the system to support a selected read data transfer rate. As can be seen from FIG. 12, a first portion of the pages above line 216 provide unacceptable BER performance, while a second portion of the pages below line 216 provide acceptable BER performance. The data can be normalized for a baseline amount of temperature excursion; for example, the data can be limited to the measured BER performance for reads that take place above a minimum amount of CTD, etc., a weighted approach can be used so that the numbers of bit errors at higher temperatures per location can be weighted with a higher coefficient, etc.

Regardless, it will be appreciated that over time, based on historical data, certain locations within the memory will be found to have greater numbers of bit errors based on higher CTD values. While page level granularity is shown, other granularities can be used including erasure block, GCU, etc.

Curve 218 shows adjusted inner code rates that are applied to the various pages to compensate for the variation of curve 214. The curve 218 is shown to have a step-wise shape such that discrete changes in code rate are applied to groups of pages. Curve 220 represents the initial inner code rate that is applied to all code words in the memory, so that an initial portion of the pages (those corresponding to the pages in curve 214 above line 216) receive higher inner code rates and a remaining portion of the pages (those corresponding to the pages in curve 214 below curve 216) receive lower inner code rates.

The resulting application of the adjusted code rates from curve 218 are shown in adjusted BER curve 222, which shows all of the BER values remain at or below the acceptable BER threshold 216.

Figure 13:
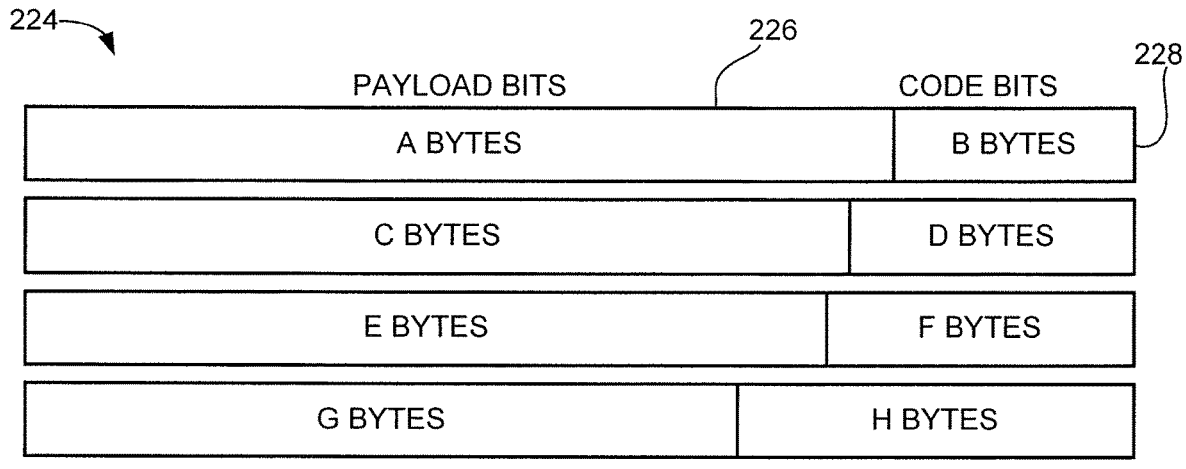
FIG. 13 shows adjustments to an inner code rate carried out by the CWMC.

FIG. 13 shows different code words 224 that can be adjusted by the circuit 210 of FIG. 11 in some embodiments in accordance with curve 218. Each code word 224 has a payload of user data 226 and an appended set of code bits 228. The first code word has A payload bytes and B bytes; the second code word has C payload bytes and D code bytes; and so on. In this example, each code word has the same total number of bits, so that as the code rate increases, a smaller total proportion of the code word is made up of user bytes. In other embodiments, the size of the user data payload can remain constant and the number of code bits can be increased. As noted above, the code bits in the fields 228 can represent low density parity check (LDPC) bits that are submitted to an LDPC decoder to enable the readback circuitry to properly decode the values of the corresponding user data bits. Other forms of ECC correction can be applied as desired.

Figure 14:
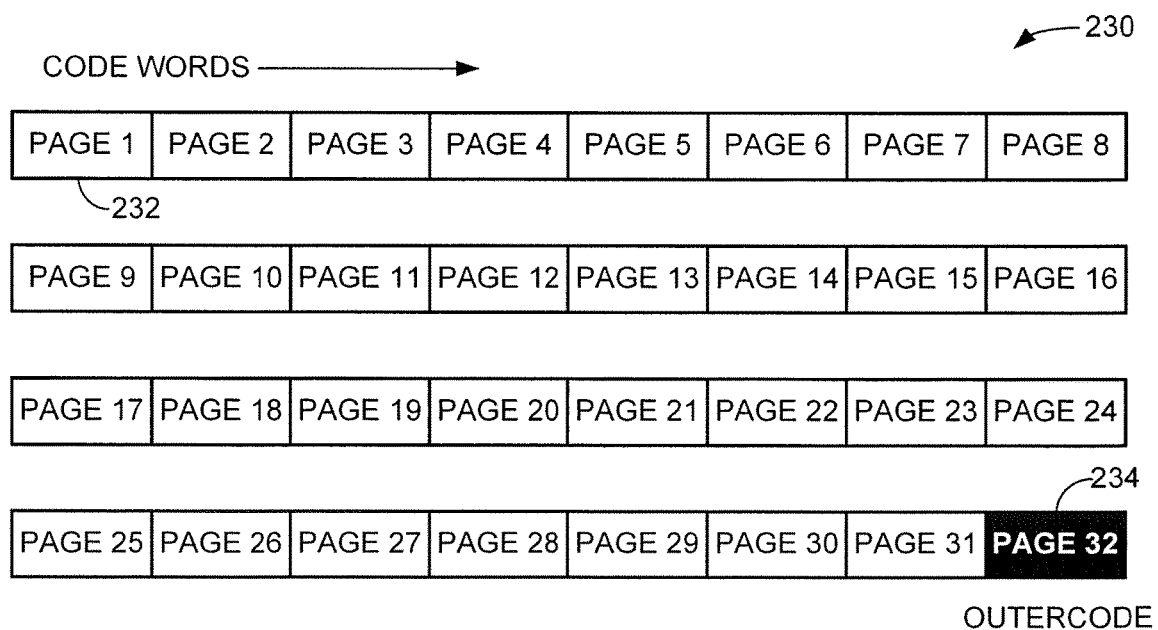
FIG. 14 shows adjustments to an outer code rate carried out by the CWMC.

It is contemplated that the circuit 210 in FIG. 11 will operate to adjust the inner code bits to compensate for CTD sensitivities. In further embodiments, adjustments can additionally or alternatively be made to the outer code bits used to correct errors in each parity set (see e.g., FIG. 9). FIG. 14 shows a parity set 230 made up of 31 pages of data, each of which in turn are made up of some number (and portions thereof) of code words 224 as in FIG. 13. These pages are in turn protected by an outer code parity value 234 that is written as the $32^{nd}$ page in each parity set. In some cases, each page is written to a separate die within the memory 140, so that the system is fault tolerant (each parity set can be fully retrieved even in the case of a single die failure using normal RAID protection schemes). As desired, higher level protection schemes can be implemented to compensate for multiple concurrent die failures.

In some embodiments, the outer code 234 is generated by applying a selected combinatorial function to the contents of the pages of user data, such as an exclusive or (XOR) function. However, as desired, if the various pages are found to have a higher than normal sensitivity to CTD variations, adjustments can be made to the outer code including reducing the total number of pages protected by each outer code value, increasing the strength of the outer code, etc. For example, instead of protecting 31 pages of data with each parity outer code value as in FIG. 14, a fewer number of pages might be protected, etc.

Figure 15:
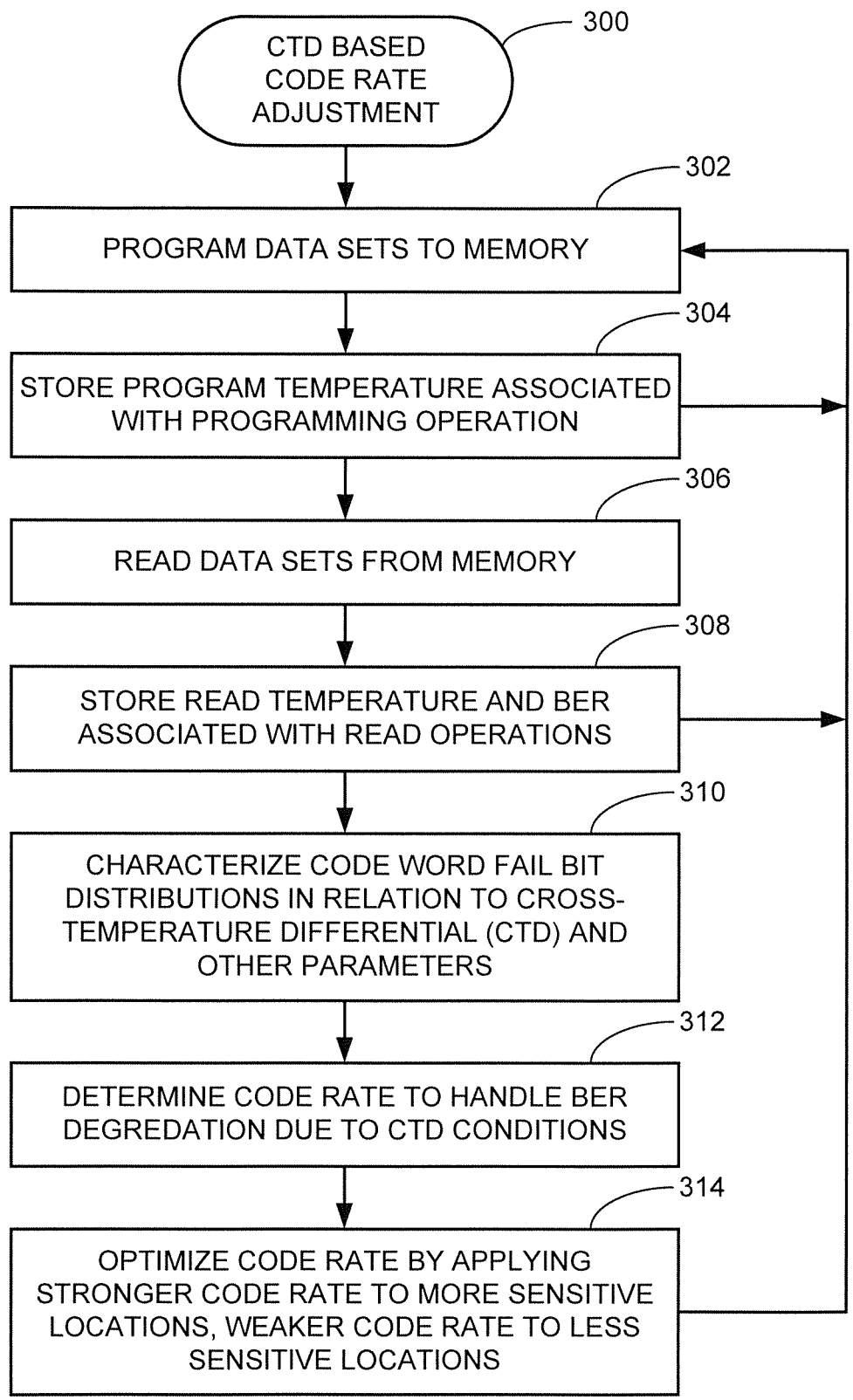
FIG. 15 is a flow chart for a CTD based code rate adjustment routine.

FIG. 15 shows a flow chart for a CTD based code rate adjustment routine 300 carried out in accordance with some embodiments by the circuit 210 of FIG. 11. It will be appreciated that the routine is merely illustrative and other steps can be carried out as desired. It will be appreciated that the routine is recursive and is carried out continuously in the background during device operation.

Various data sets are programmed to the memory at step 302, and various associated parameters are recorded that are associated with the programming operation at step 304. These parameters can take a variety of forms including programming temperature, date/time stamp, etc.

The data sets are thereafter read as required at step 306, and other parameters are recorded that are associated with these read operations such as read temperatures, measured BER, NVMe location, etc. at step 308. These various steps are repeated as required to service various host read and write commands to transfer data to and from the flash memory 140.

At appropriate times when sufficient historical data have been accumulated, the circuit 210 of FIG. 11 operates to characterize code word fail bit distributions in relation to the cross-temperature differentials (CTDs) and other associated parameters such as PE counts, data aging, read counts, etc., step 310. This enables the circuit to sort the various memory locations, such as on a page level, to identify locations that are more sensitive and are less sensitive to temperature excursions, as represented by curve 214 in FIG. 12.

A code rate that is sufficient to handle the BER degradations due to CTD conditions is next determined for each memory location, step 312. This is represented by the curve 218 in FIG. 12. In some cases, incremental adjustments may be made over time so that the system adaptively adjusts the code rates until acceptable levels of BER performance are achieved. Empirical data can be used as part of this process to estimate the appropriate new code rates that should be applied to the sensitive memory locations.

As shown at step 314, the system proceeds to optimize the code rate by applying higher code rates to more sensitive locations and, as desired, lower code rates to less sensitive locations, as indicated in FIG. 12. In this way, more uniform BER performance is attained across all memory locations while not significantly affecting the overall data storage capacity of the memory.

Figure 16:
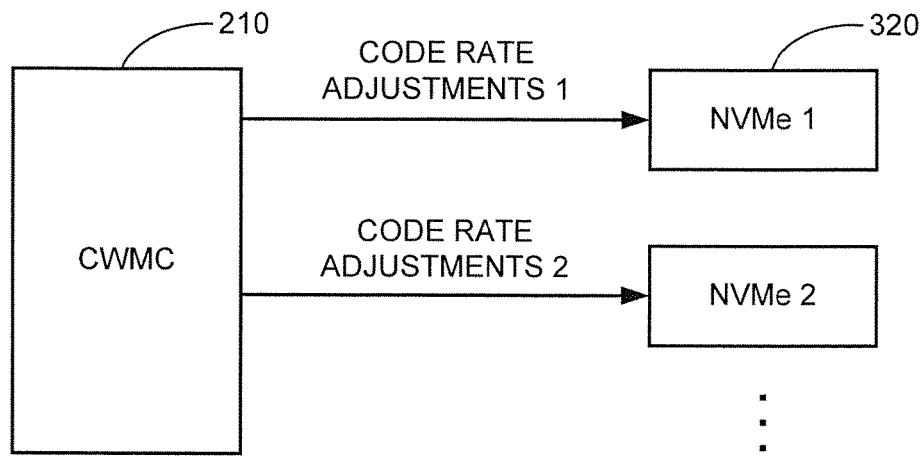
FIG. 16 shows an exemplary operation of the CWMC circuit in managing portions of the NVM of the SSD of FIG. 2 arranged into different NVMe Namespaces.

FIG. 16 shows the code word management circuit (CWMC) 210 operative to provide different code rate adjustments to the code words used by different sets of user data in different NVMe Namespaces 320. In this way, user inputs can be used to adjust the rate at which the system operates to generate code words and manage code rates to balance read performance versus temperature sensitivity within the same storage device.

Figure 17:
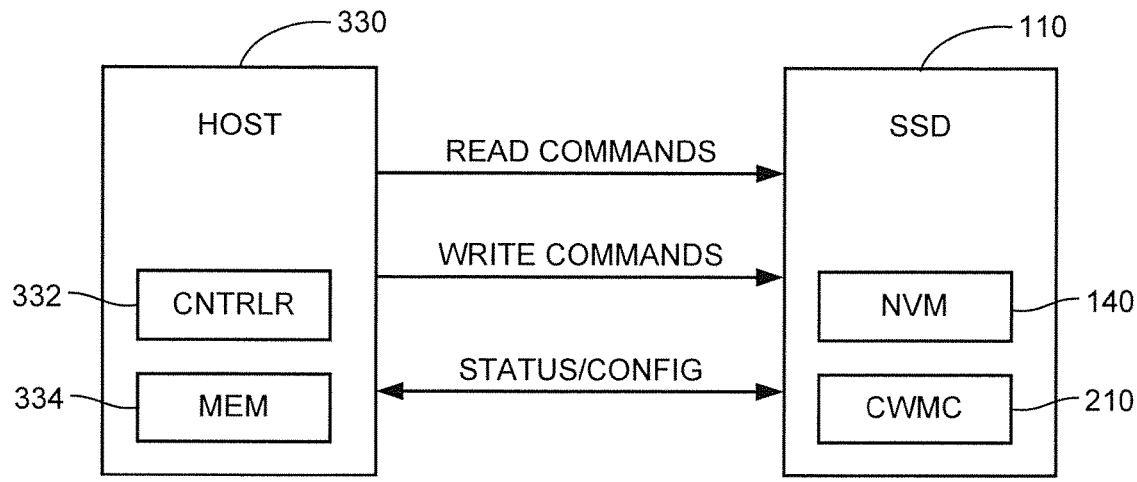
FIG. 17 shows the SSD of FIG. 2 operably coupled to a host device.

FIG. 17 shows a host device 330 coupled to the SSD 110. The host device 330 includes a host controller 332 and a host memory 334. Various read and write commands are issued by the host 330 to transfer data from and to the NVM 140 of the SSD 110. Various status and configuration commands/data exchanges are further provided to control the operation of the CWMC 210 in managing the arrangement of the data within the NVM 140.

Figure 18:
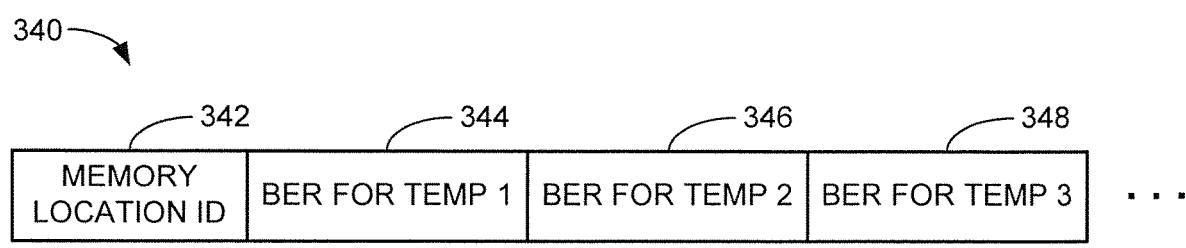
FIG. 18 shows a data structure that can be generated and utilized by the CWMC to track parametric data for different memory locations in some embodiments.

FIG. 18 shows a data structure 340 stored in memory by the CWMC 210 in some embodiments. It will be appreciated that the data necessary for the circuit 210 to operate will tend to span multiple data sets that have been stored to a given location. Stated another way, the circuit 210 will tend to accumulate various parameters over time for each memory location ID 342, including measured BER results at different CTD values, as indicated by data fields 344, 346, 348. These data values can be analyzed to provide the sorting function necessary to sort the memory locations as illustrated in FIG. 12.

It is to be understood that even though numerous characteristics and advantages of various embodiments of the present disclosure have been set forth in the foregoing description, together with details of the structure and function of various embodiments of the disclosure, this detailed description is illustrative only, and changes may be made in detail, especially in matters of structure and arrangements of parts within the principles of the present disclosure to the full extent indicated by the broad general meaning of the terms in which the appended claims are expressed.

What is claimed is:

1. A method comprising:
   baselining cross-temperature differential (CTD) effects on different portions of non-volatile memory (NVM) cells by measuring a sequence of programming temperatures at which data are programmed to the different portions of the NVM cells and reading temperatures at which data are read from the different portions of the NVM cells;
   tracking error rates for the NVM cells during each of the reading of the data from the NVM cells to determine that a first portion of the NVM cells is comparatively more sensitive to the CTD conditions and that a second portion of the NVM cells is comparatively less sensitive to the CTD conditions; and
   adjusting the first portion of the NVM cells to a first adjusted error code rate and adjusting the second portion of the NVM cells to a different second adjusted error code rate to maintain a selected error rate in the first and second portions of the NVM cells responsive to a subsequent CTD value exceeding a selected threshold.

2. The method of claim 1, wherein the data are arranged as code words, each code word comprising a payload of user data bits and a corresponding number of code bits used to detect errors in the user data bits.

3. The method of claim 2, wherein the code bits are characterized as LDPC (low density parity check) code bits that are processed by an LDPC decoder to return the originally stored user data bits.

4. The method of claim 2, wherein the code rate is adjusted by increasing a ratio of the code bits to the first portion of the NVM cells and by decreasing the ratio of the code bits to the user data bits for the second portion of the NVM cells.

5. The method of claim 1, wherein at least one of the code rates adjusted during the adjusting step is an inner code rate of code words written to the NVM cells.

6. The method of claim 1, wherein at least one of the code rates adjusted during the adjusting step is an outer code rate of a parity value of a parity set of code words written across multiple dies of the NVM cells.

7. The method of claim 1, wherein the NVM cells store data in the form of pages, and the code rates are adjusted during the adjusting step at a page level.

8. The method of claim 1, wherein the NVM cells are characterized as a flash memory.

9. The method of claim 1, wherein the NVM cells are arranged into a plurality of namespaces in accordance with the Non-Volatile Memory Express (NVMe) Standard, and wherein different code rates are applied to the data stored in the different ones of the plurality of namespaces responsive to a user input associated with an owner of each namespace.

10. An apparatus comprising:
a non-volatile memory (NVM) comprising solid-state memory cells;
a read/write circuit configured to program the memory cells with data bits and to subsequently read the data bits from the memory cells;
a tracking circuit configured to measure error rates for the memory cells during each of the reading of the data from the memory cells, to baseline cross-temperature differential (CTD) effects on different portions of the memory cells by measuring temperatures of the different portions of the memory cells during both the programming of the different portions of the memory cells and the reading of the different portions of the memory cells and to determine that a first portion of the memory cells is comparatively more sensitive to the CTD effects and that a second portion of the memory cells is comparatively less sensitive to the CTD effects; and
a code word management circuit configured to adjust the first portion of the memory cells to a first adjusted error code rate and to adjust the second portion of the memory cells to a different second adjusted error code rate to maintain a selected error rate in the first and second portions of the memory cells responsive to a subsequent cross-temperature differential (CTD) value exceeding a selected threshold.

11. The apparatus of claim 10, wherein at least one of the first and second adjusted code rates is an inner code rate of code words written to the NVM so that the data programmed by the read/write circuit comprises a higher proportion of code bits to user data bits in each of the code words written to the NVM.

12. The apparatus of claim 10, wherein at least one of the first and second adjusted code rates is an outer code rate of a parity value of a parity set of code words written across multiple dies of the NVM.

13. The apparatus of claim 10, wherein the NVM stores data in the form of pages, and the code rates are adjusted at a page level.

14. The apparatus of claim 10, wherein the NVM is characterized as a flash memory.

15. A solid-state drive, comprising:
a flash memory comprising an array of flash memory cells;
a write circuit configured to write pages of data to each of first and second sets of the flash memory cells, each page in the form of a plurality of code words, and each code word comprising a first number of user data bits and a second number of code bits;
a read circuit configured to subsequently read the pages of data from the respective sets of the flash memory cells by using the code bits in each code word to detect and correct errors in the corresponding user data bits;
a tracking circuit configured to baseline temperature effects on the first and second sets of the flash memory cells by measuring a programming temperature of the flash memory at a time of the programming of each page of data, to measure a reading temperature of the flash memory at a time of reading each page of data, and to measure a total number of bit errors obtained during the reading of each page of data to determine that the first set of flash memory cells is comparatively more sensitive to the temperature effects than the second set of flash memory cells; and
a code word management circuit configured to adjust a code rate for at least the first set of memory cells so that, upon said adjustment, a new page of data subsequently written thereto has a different ratio of code bits to user data bits responsive to the measured programming temperature, the measured reading temperature, and the number of bit errors.

16. The solid-state drive of claim 15, wherein the flash memory comprises a three dimensional (3D) NAND flash memory.

17. The solid-state drive of claim 15, wherein the code bits are characterized as LDPC (low density parity check) code bits that are processed by an LDPC decoder to return the originally stored user data bits.

18. The solid-state drive of claim 15, wherein the code rate of the first set of flash memory cells is adjusted by increasing a ratio of the code bits to the user data bits responsive to the higher error rate in relation to a differential between the reading temperature and the programming temperature, and wherein the code rate of the second set of flash memory cells is adjusted by decreasing the ratio of the code bits to the user data bits responsive to the lower error rate in relation to the differential between the reading temperature and the programming temperature.

19. The solid-state drive of claim 15, wherein the code word circuit is realized as a programmable processor that utilizes programmable instructions stored in a memory.

20. The solid-state drive of claim 15, wherein at least one of the code rates is adjusted to provide a subsequent error rate of the associated location in the flash memory to below a predetermined acceptable threshold.

* * * * *